(12) United States Patent
Holmberg, Jr. et al.

(10) Patent No.: US 10,916,326 B1
(45) Date of Patent: Feb. 9, 2021

(54) SYSTEM AND METHOD FOR DETERMINING DIMM FAILURES USING ON-DIMM VOLTAGE REGULATORS

(71) Applicant: DELL PRODUCTS, LP, Round Rock, TX (US)

(72) Inventors: Richard L. Holmberg, Jr., Austin, TX (US); Jordan Chin, Austin, TX (US); Wade Andrew Butcher, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/569,543

(22) Filed: Sep. 12, 2019

(51) Int. Cl.
  *G11C 29/50* (2006.01)
  *G06F 11/07* (2006.01)
  *G11C 11/4072* (2006.01)
  *G11C 11/4074* (2006.01)

(52) U.S. Cl.
  CPC ...... *G11C 29/50004* (2013.01); *G06F 11/073* (2013.01); *G06F 11/0793* (2013.01); *G11C 11/4072* (2013.01); *G11C 11/4074* (2013.01); *G11C 2029/5004* (2013.01)

(58) Field of Classification Search
  CPC .......... G11C 29/50004; G11C 11/4072; G11C 11/4074; G11C 2029/5004; G06F 11/073; G06F 11/0793
  See application file for complete search history.

(56) References Cited

U.S. PATENT DOCUMENTS

| | | | |
|---|---|---|---|
| 9,928,897 B2 | 3/2018 | Bacchus et al. | |
| 2008/0082661 A1* | 4/2008 | Huber | H04L 41/0681 709/224 |
| 2010/0128447 A1 | 5/2010 | MacDougall et al. | |
| 2014/0298109 A1* | 10/2014 | Nishiyama | G06F 11/1044 714/42 |
| 2015/0178096 A1* | 6/2015 | Inbaraj | G06F 8/65 713/2 |
| 2016/0253471 A1* | 9/2016 | Volpe | G06F 9/4401 607/5 |
| 2017/0147455 A1* | 5/2017 | Sakuma | G06F 11/2046 |
| 2018/0081910 A1* | 3/2018 | Sharma | G06F 16/21 |
| 2018/0173580 A1* | 6/2018 | Pavlas | G06F 11/1441 |

* cited by examiner

*Primary Examiner* — Kyle Vallecillo
(74) *Attorney, Agent, or Firm* — Larson Newman, LLP

(57) ABSTRACT

An information handling system includes a processor and memory devices that each include a voltage regulator configured to be enabled by a command from the processor. The processor boots the information handling system, including providing the command to the memory devices, and detects that one of the memory devices failed to boot. The processor determines that it is unknown whether the failing memory device is the first memory device or the second memory device. In response, the processor determines which one of the memory devices failed to boot, by rebooting the information handling system, providing a command to a selected one of the memory devices, and determining whether or not the selected one of the memory devices failed to boot.

20 Claims, 4 Drawing Sheets

US 10,916,326 B1

SYSTEM AND METHOD FOR DETERMINING DIMM FAILURES USING ON-DIMM VOLTAGE REGULATORS

FIELD OF THE DISCLOSURE

The present disclosure generally relates to information handling systems, and more particularly relates to determining Dual In-Line Memory Module (DIMM) failures using on-DIMM voltage regulators.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system may include a processor and memory devices that each include a voltage regulator configured to be enabled by a command from the processor. The processor may boot the information handling system, may provide the command to the memory devices, and may detect that one of the memory devices failed to boot. In response, the processor may determine which one of the memory devices failed to boot, by rebooting the information handling system, providing a command to a selected one of the memory devices, and determining whether or not the selected one of the memory devices failed to boot.

An information handling system includes a processor and memory devices that each include a voltage regulator configured to be enabled by a command from the processor. The processor boots the information handling system, including providing the command to the memory devices, and detects that one of the memory devices failed to boot. The processor determines that it is unknown whether the failing memory device is the first memory device or the second memory device. In response, the processor determines which one of the memory devices failed to boot, by rebooting the information handling system, providing a command to a selected one of the memory devices, and determining whether or not the selected one of the memory devices failed to boot.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
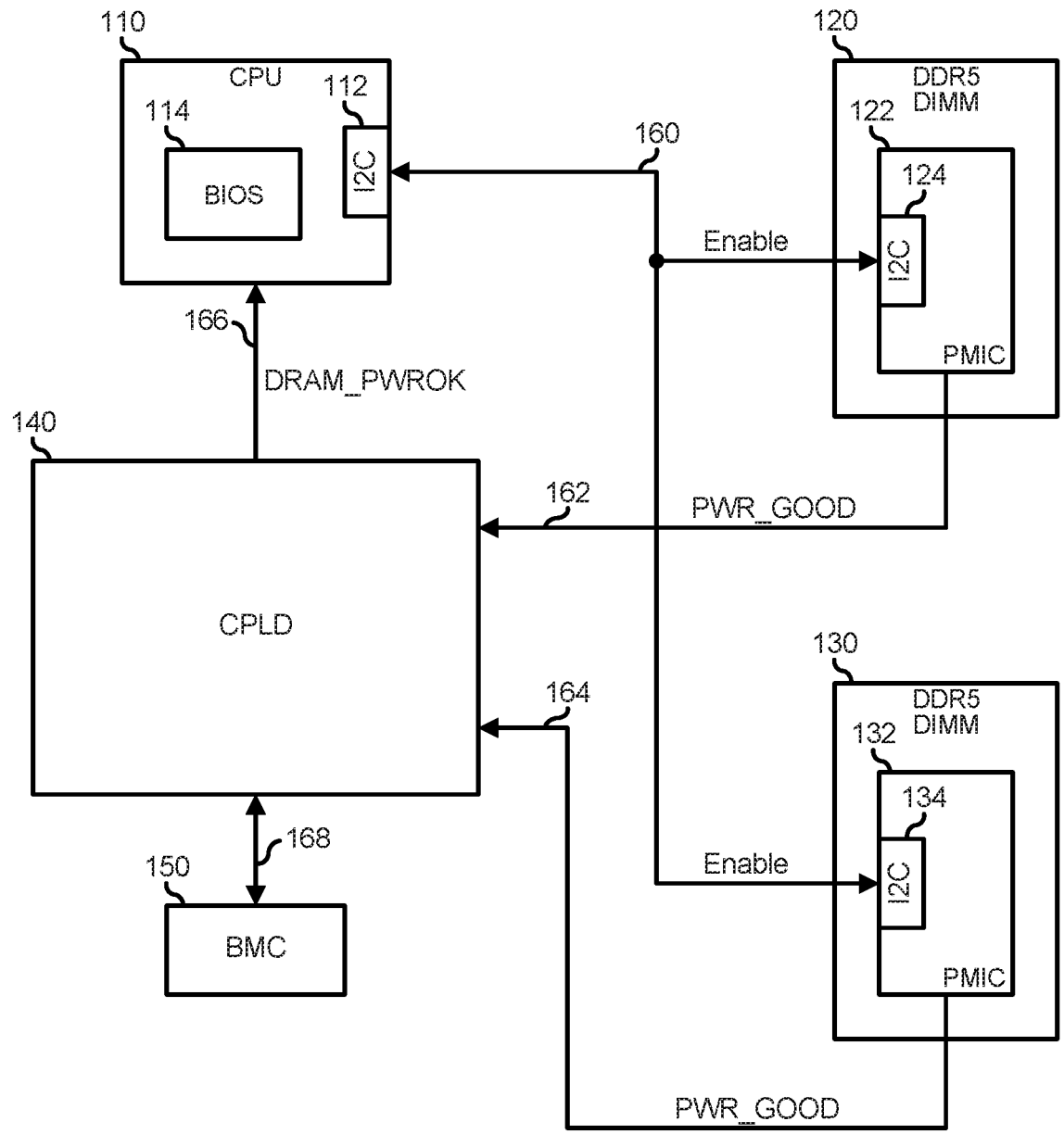
FIG. 1 is a block diagram of an information handling system according to an embodiment of the present disclosure.

FIG. 1 illustrates an information handling system 100, including a CPU 110, Dual Data Rate 5 (DDR5) Dual In-Line Memory Modules (DIMMs) 120 and 130, a complex programmable logic device (CPLD) 140, and a Baseboard Management Controller (BMC) 150. CPU 110 includes an Inter-Integrated Circuit (I2C) interface 112 and operates to execute code to implement a Basic Input/Output System/Universal Extensible Firmware Interface (BIOS) 114. DIMMs 120 and 130 include respective power management integrated circuits (PMICs) 122 and 132. PMICs 122 and 132 include respective I2C interfaces 124 and 134. In a particular embodiment, I2C interface 112 operates as an I2C bus master and I2C interfaces 124 and 134 operate as I2C bus slaves, such that CPU 110 can send I2C commands to PMICs 122 and 132, and the PMICs can respond to the commands from the CPU. It will be understood that one or more of I2C interfaces 112, 124, and 134 may operate as I2C bus master/slaves, as needed or desired. It will be understood that information handling system 100 may include one or more additional DDR5 DIMMs as needed or desired. It will be further understood that, where CPU 110 and DIMMs 120 and 130 each include respective I2C interfaces 112, 124, and 134, the present disclosure broadly relates to side-band communications between processors, baseboard management controllers, and memory devices, and that the specific side-band communication interface can include other interfaces than the I2C interface illustrated herein. In particular, it will be understood that the side-band interface as specified for DDR5 DIMMs may include an interface that is in compliance with the MIPI Alliance Improved Inter-Integrated Circuit (I3C) specification. Moreover, the present disclosure is not limited to communications with memory devices only, but relates more broadly to side-band communications between other devices with integrated or on-board power management devices similar to the PMIC devices illustrated on the DDR5 DIMMs herein, and that thus other side-band interfaces are contemplated herein, as needed or desired.

In previous generations of DDR memory (e.g., DDR3, DDR4), the DDR DIMMs received conditioned power rails from the main printed circuit board (PCB) into which the DDR DIMMs were installed. As such, the main PCB would include voltage regulators to convert main and auxiliary power voltages, typically 12 V and 5 V, into the voltage levels needed by the DIMMs, typically 2.5 V, 1.8 V, 1.2 V, and variously specified data signaling voltage levels. Here, a power up sequence for previous generations of DDR memory would consist of providing the main and auxiliary power voltages to the various voltage regulators as soon as the main and auxiliary power rails become energized, and ensuring that the various DIMM voltage rails become energized simultaneously, in order to prevent lock-up of the memory device on the DIMMs. It will be understood that variations in the details may be needed for the different previous generations of DDR memory.

Figure 2:
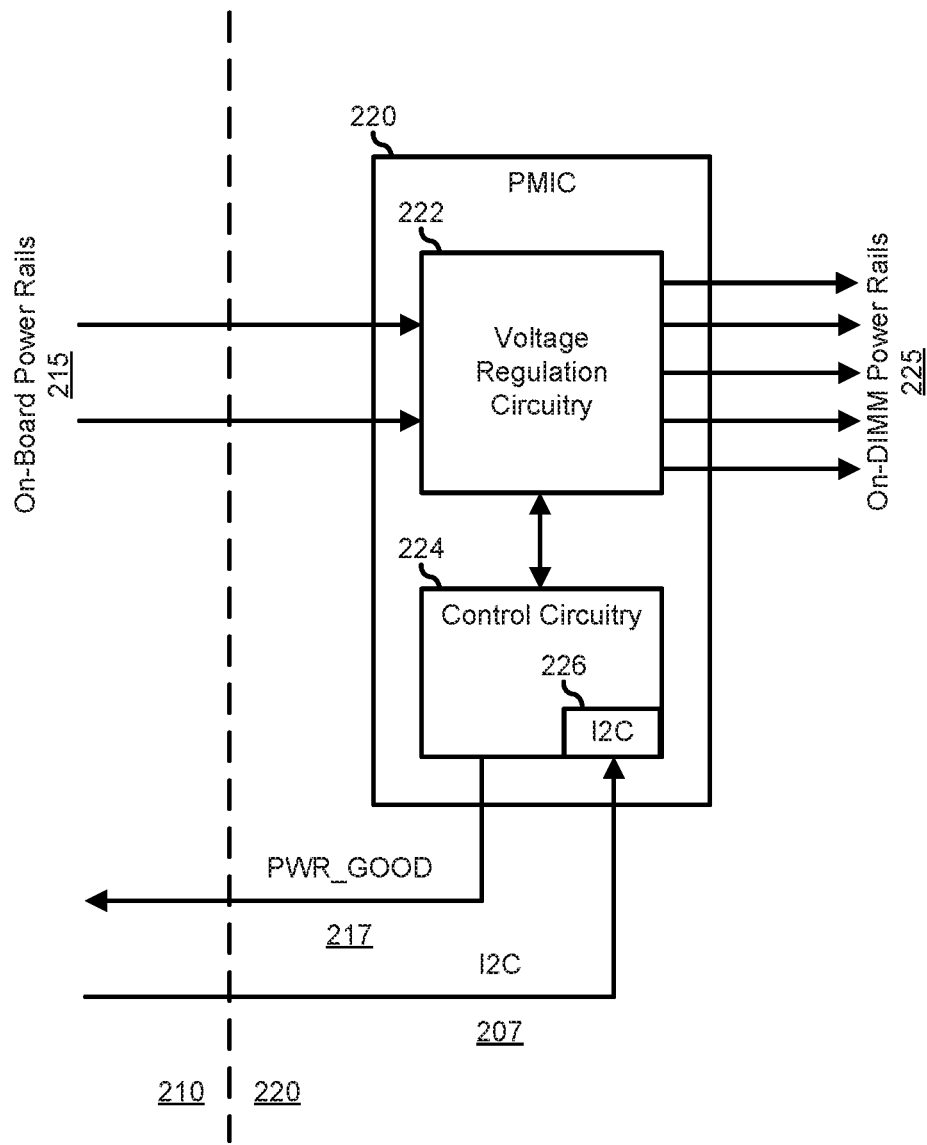
FIG. 2 is a diagram of an information handling system according to another embodiment of the present disclosure.

FIG. 2 illustrates an information handling system 200 similar to information handling system 100. Information handling system 200 includes a main PCB 210 and a DDR5 DIMM 220. DDR5 DIMM 220 includes a PMIC 220. PMIC 220 includes voltage regulation circuitry 222 and control circuitry 224. Control circuitry 224 includes an I2C interface 226. In contrast to previous generations of DDR memory, the DDR5 memory architecture is specified such that each DDR5 DIMM includes a PMIC that provides voltage regulation circuitry to convert the main and auxiliary voltages from the main PCB to the voltage levels needed by the DIMM. As such, voltage regulation circuitry 222 receives onboard power rails 215, that is, the main and auxiliary power rails, from main PCB 210 and converts the voltages from the onboard power rails to the voltages needed by on-DIMM power rails 225. Note that onboard power rails 215 are provided to voltage regulation circuitry 222 as soon as the onboard power rails become energized. However, voltage regulation circuitry 222 does not energize on-DIMM power rails 225 until such time as the voltage regulation circuitry is directed to do so by control circuitry 224. In particular, control circuitry 224 does not direct voltage regulation circuitry 222 to energize on-DIMM power rails 225 until the control circuitry receives a command to power up DDR5 DIMM 220 via I2C interface 226.

When control circuitry 224 receives the command to power up DDR5 DIMM 220 and voltage regulation circuitry 222 energizes on-DIMM power rails 225, the voltage regulation circuitry monitors the health of the on-DIMM power rails. When all of on-DIMM power rails 225 are up and healthy, voltage regulation circuitry 222 informs control circuitry 224 that all of the on-DIMM power rails are healthy, and the control circuitry provides a PWR_GOOD signal to man PCB 210 to indicate that DDR5 DIMM 220 has successfully been powered up. If there are problems detected in energizing on-DIMM power rails 225, voltage regulation circuitry 222 informs control circuitry 224 that there was a problem, and the control circuitry withholds the PWR_GOOD signal to main PCB 210.

Returning to FIG. 1, when information handling system 100 is powered on, DIMMs 120 and 130 receive voltage from the onboard power rails as soon as the onboard power rails become energized. However, DIMMs 120 and 130 will not proceed to power up until CPU 110 directs respective PMICs 122 and 132 to do so via I2C bus 160. The power up sequence of DIMMs on an information handling system may be flexibly enabled based upon the timing of the commands from the CPU to the PMIC. For example, all DIMMs of an information handling system may be directed to be powered up simultaneously, each DIMM may be directed to be powered up at different times, or groups of DIMMs may be directed to be powered up at a first time while other groups of DIMMs may be directed to be powered up at a later time, as needed or desired. Here, when each of DIMMs 120 and 130 are directed to be powered up by CPU 110, the voltage regulation circuitry of respective PMICs 122 and 132 each energize the respective on-DIMM power rails and monitor the health of the respective on-DIMM power rails as described above. When all of on-DIMM power rails of DIMM 120 are up and healthy, PMIC 122 provides a PWR_GOOD signal 162 to CPLD 140. Similarly, when all of on-DIMM power rails of DIMM 130 are up and healthy, PMIC 122 provides a PWR_GOOD signal 164 to CPLD 140. When CPLD 140 receives all of PWR_GOOD signals 162 and 164, the CPLD provides a DRAM_PWROK signal to CPU 110 indicating that all of DIMMs 120 and 130 have been successfully powered up.

It has been noted that certain types of DIMM failures may cause problems that lead to the inability of an information handling system to boot properly. When support personnel suspect that one or more DIMM installed into an information handling system is responsible for a failure to boot, the support personnel have historically debugged such a problem by selectively removing and reseating the DIMMs in order to identify the particular DIMM or DIMMs that are responsible for the failure to boot. Various algorithms for narrowing down to the failing DIMMs can be employed by the support personnel based upon experience or preference.

In a particular embodiment, BIOS 114 manages the power up sequence for DIMMs 120 and 130, and implements a voltage regulator (VR) time limit to detect that all DIMMs in information handling system 100 have been successfully powered up. Here, a timer measures the amount of time between the issuance of the command to power up DIMMs 120 and 130 on I2C bus 160 by CPU 110, and the time that the CPU receives DRAM_PWROK signal 166. If the time difference exceeds the VR time limit, then BIOS 114 recognizes that at least one of DIMM 120 and 130 have failed to successfully power up. However, it will be understood that, because CPLD 140 only provides DRAM_PWROK signal 166 when all of PWR_GOOD signals 162 and 164 have been received, BIOS 114 is unable to determine whether the failure was on DIMM 120, on DIMM 130, or on both of the DIMMs.

In a particular case, after BIOS 114 directs PMICs 122 and 132 to power up the on-DIMM power rails, and the on-DIMM power rails have been powered up, a failure may occur that is detected by one of the PMICs, and the particular PMIC may power down the on-DIMM power rails for that DIMM. In some cases, the PMIC may respond with an unsolicited command on its I2C interface back to CPU 110, indicating that the particular DIMM experienced a failure during a power on sequence. Further, the PMICs may retain the information that the associated DIMM experienced a power on failure, for example by storing an indication to that effect in a register or other non-volatile storage element. Here, on a subsequent boot of information handling system 100, BIOS 114 can read the stored information that the DIMM experienced the power on failure, and can withhold the command to the PMIC of that DIMM to power up the DIMM. However, there remain cases where the PMIC of a DIMM is unable to provide the unsolicited command to the CPU to indicate that the DIMM experienced a power on failure. Here, as in the above case, CPLD 140 will not provide DRAM_PWROK signal 166 to CPU 110, but again, BIOS 114 is unable to determine whether the failure was on DIMM 120, on DIMM 130, or on both of the DIMMs.

When BIOS 114 detects a failure of one or more of DIMMs 120 and 130 to successfully power up, that is, the BIOS determines that DRAM_PWROK signal 166 was not received within the VR time limit, then the BIOS initiates a method to determine which one of the DIMMs experienced the unsuccessful power up. Here, BIOS 114 repeatedly re-boots information handling system 100, where, on each reboot, the BIOS sends commands to selected DIMMs to determine if the failure occurred on the selected DIMMs. Here, when a failing DIMM is among the selected DIMMs, BIOS 114 will not receive DRAM_PWROK signal 166 prior to the expiration of the VR time limit, but if each of the selected DIMMs is successfully powered up, each DIMM will provide its PWR_GOOD signal to CPLD 140, and the CPLD will issue the DRAM_PWROK signal to CPU 110. When BIOS 114 has determined which one of DIMMs 120 and 130 experienced the unsuccessful power-up, the BIOS operates to withhold the command to power up that DIMM on during future boot processes. For example, BIOS 110 may store an indication within a non-volatile storage device of information handling system 100, indicating that the particular DIMM has failed to power up, or BIOS may write such an indication to a register of the PMIC or to another non-volatile storage device of the DIMM for reading during a subsequent boot process. In a particular embodiment, BIOS 110 operates to provide an indication to a management system via BMC 150, indicating to support personnel to replace the failing DIMM.

The duration of the VR time limit may be determined based upon the particular DIMMs 120 and 130. Here, during system boot, BIOS 114 may determine information about DIMMs 120 and 140 based upon information stored in a non-volatile media on the DIMMs or in registers within PMICs 122 and 132. The information may include a maximum time between the time that the DIMM receives the command to power up the DIMM on its I2C interface, and the time that the DIMM provides its PWR_GOOD signal. Then, BIOS 114 can determine the duration of the VR time limit as the longest time between receipt of the command to power up the DIMMs and the provision of the associated PWR_GOOD signal, plus a predetermined amount of time for CPLD 140 to issue the DRAM_PWROK signal after receiving all of the DIMM PWR_GOOD signals.

BIOS 114 may search for failing DIMMs utilizing known search algorithms. In a first example, BIOS 114 can direct CPU 110 to issue the command to power up only one DIMM at a time, and thus determine which DIMM experienced the failure. In another example, BIOS 114 can perform a binary search, enabling a first half of the DIMMs. Then if there was no failure, BIOS 114 can enable the second half of the DIMMS. When one of the groups of enabled DIMMs experiences a DIMM failure, BIOS 114 can then enable a first half of the group of DIMS that experienced the DIMM failure. BIOS 114 can continue the binary search until each failing DIMM is identified. Other search algorithms may be utilized by BIOS 114 to identify failing DIMMs as needed or desired. In a particular embodiment, once BIOS 114 has identified the failing DIMMs, the BIOS operates to notify a management system of the failing DIMMs. For example, BIOS 114 can provide the identities of the failing DIMMs to BMC 150 for reporting to a datacenter management system.

In another embodiment, after DIMMs 120 and 130 have been successfully powered up, and CPLD 140 has timely issued DRAM_PWROK signal 166, BIOS 110 may store data to a memory location on one of DIMMs 120 and 130, and may subsequently try to read the stored data back from the DIMM, but the memory read may result in a multi-bit error, causing a crash of information handling system 100. Such a multi-bit error may result from a DRAM failure on the DIMM, a poor connection in a connector between the DIMM and the main PCB, a fault on the main PCB, a failure on a memory controller, or the like. Typically, during the boot process, BIOS 110 implements various Reliability, Availability, and Serviceability (RAS) functions to handle such multi-bit errors. In particular, such RAS functions may include correlating a memory location with a particular DIMM. However, if such errors occur during the system boot process after the DIMM power up sequence, but before the implementation of the RAS functions, there may be no ability of BIOS 110 to determine which one of DIMMs 120 and 130 were responsible for the multi-bit error. When BIOS 114 detects a multi-bit error, but is unable to resort to RAS features to determine the source of the error, then the BIOS initiates the previously described method to determine which one of the DIMMs experienced the multi-bit error.

Figure 3:
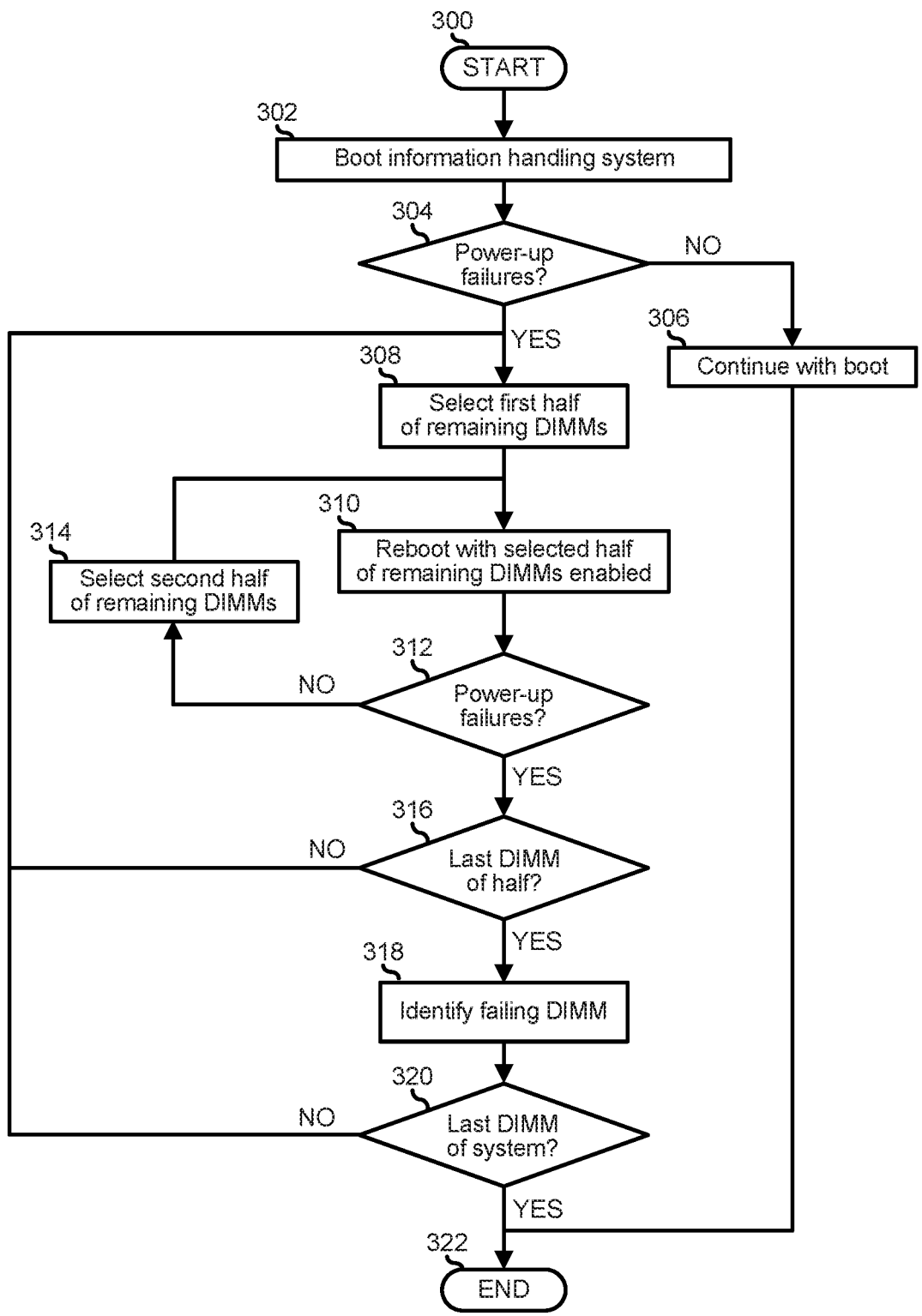
FIG. 3 is a flowchart illustrating a method for determining failing DIMMs using on-DIMM voltage regulators.

FIG. 3 is a flowchart illustrating a method for determining failing DIMMs using on-DIMM voltage regulators, starting at block 300. An information handling system is booted in block 302. The information handling system may include memory devices, such as DDR5 DIMMs, that have a separate voltage regulator on-DIMM that is commanded by a system BIOS to power up the power rails of the memory devices. The boot process can include comparing a time at which the BIOS directs the memory devices to be powered up to a time that the BIOS receives an indication that the memory devices were successfully powered up. A decision is made as to whether or not there were any power up failures with the memory devices in decision block 304. For example, the BIOS may determine that there were power up failures with the memory devices when no indication that the memory devices were successfully powered up is received by the BIOS for a duration of time that exceeds a VR time limit.

If there were not any power up failures with the memory devices, the "NO" branch of decision block 304 is taken, the system boot process is continued in block 306, and the method ends in block 322. If there were any power up failures with the memory devices, the "YES" branch of decision block 304 is taken, and a first half of the memory devices is selected in block 308. The information handling system is booted, the BIOS directing the first half of the memory devices to be directed to be powered up in block 310. A decision is made as to whether or not there were any power up failures of the selected half of the memory devices in decision block 312. If not, the "NO" branch of decision block 312 is taken, a second half of the memory devices is selected in block 314, and the method returns to block 310 where the information handling system is booted, the BIOS directing the second half of the memory devices to be directed to be powered up.

If there were any power up failures with the memory devices, the "YES" branch of decision block 312 is taken and a decision is made as to whether or not the selected half of the memory devices consists of a single memory device in decision block 316. If not, the "NO" branch of decision block 316 is taken and the method returns to block 308 where a first half of the remaining memory devices is selected. If the selected half of the memory devices consists of a single memory device, the "YES" branch of decision block 316 is taken and the single memory device is identified as a failing memory device in block 318. A decision is made as to whether or not the failing memory device is the last memory device in the information handling system in decision block 320. If not, the "NO" branch of decision block 320 is taken and the method returns to block 308 where a first half of the remaining memory devices is selected. If the failing memory device is the last memory device in the information handling system, the "YES" branch of decision block 320 is taken and the method ends in block 322. It will be understood that future boots of the information handling system may be performed where the BIOS does not direct the identified failing memory devices to be powered up. It will be further understood that the BIOS may inform a management system of the identities of the failing memory devices, such as by providing a list of the failing memory devices to a BMC.

Figure 4:
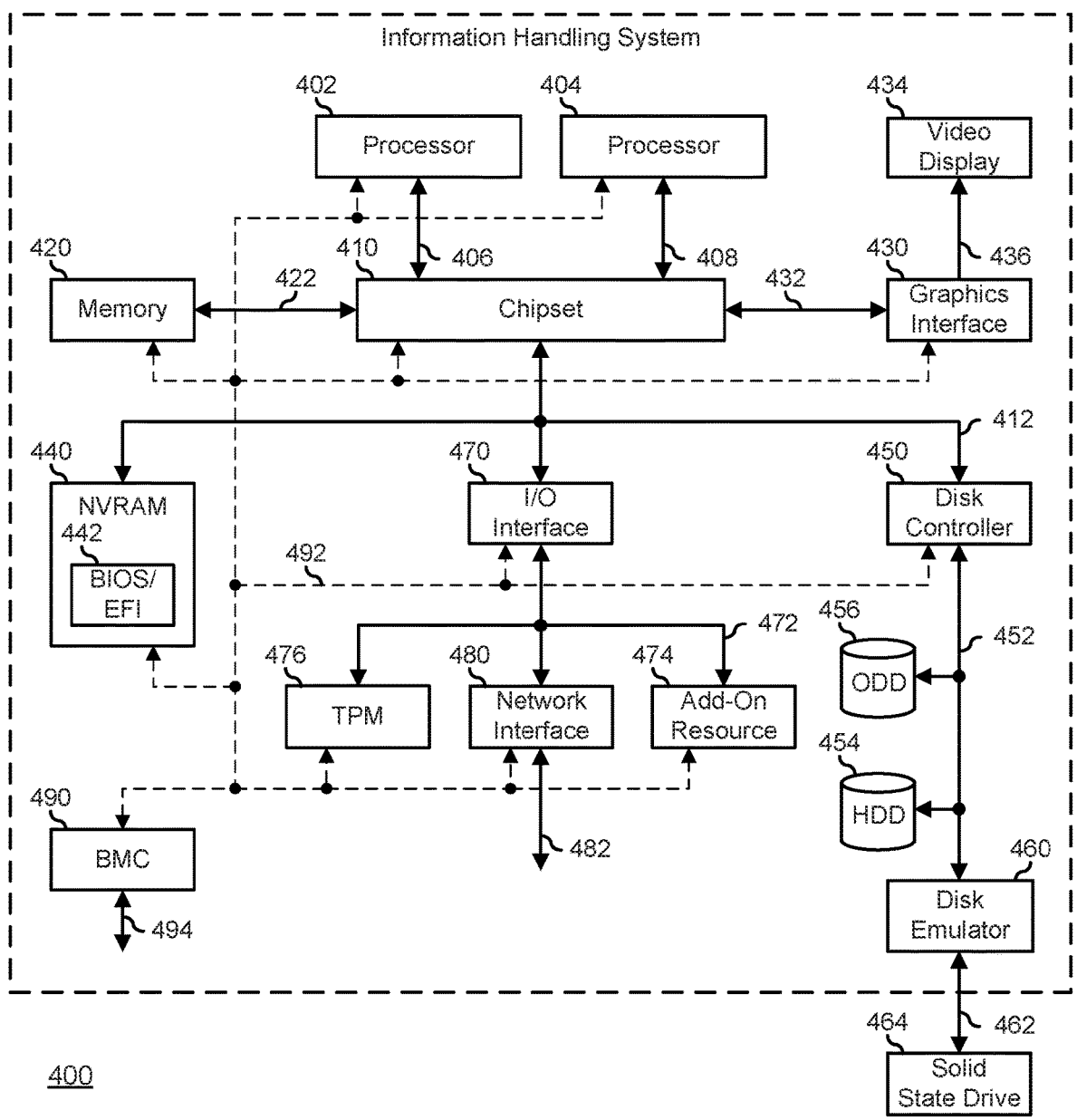
FIG. 4 is a block diagram of a general information handling system according to at least one embodiment of the disclosure.

FIG. 4 illustrates a generalized embodiment of information handling system 400. For purpose of this disclosure information handling system 400 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 includes processors 402 and 404, a chipset 410, a memory 420, a graphics adapter 430 connected to a video display 434, a non-volatile RAM (NV-RAM) 440 that includes a basic input and output system/extensible firmware interface (BIOS/EFI) module 442, a disk controller 450, a hard disk drive (HDD) 454, an optical disk drive 456, a disk emulator 460 connected to a solid state drive (SSD) 464, an input/output (I/O) interface 470 connected to an add-on resource 474 and a trusted platform module (TPM 476, a network interface 480, and a baseboard management controller (BMC) 490. Processor 402 is connected to chipset 410 via processor interface 406, and processor 404 is connected to the chipset via processor interface 408. In a particular embodiment, processors 402 and 404 are connected together via a high-capacity coherent fabric, such as a HyperTransport link, a QuickPath Interconnect, or the like. Chipset 410 represents an integrated circuit or group of integrated circuits that manages the data flows between processors 402 and 404 and the other elements of information handling system 400. In a particular embodiment, chipset 410 represents a pair of integrated circuits, such as a northbridge component and a southbridge component. In another embodiment, some or all of the functions and features of chipset 410 are integrated with one or more of processors 402 and 404. Memory 420 is connected to chipset 410 via a memory interface 422. An example of memory interface 422 includes a Double Data Rate (DDR) memory channel and memory 420 represents one or more DDR Dual In-Line Memory Modules (DIMMs). In a particular embodiment, memory interface 422 represents two or more DDR channels. In another embodiment, one or more of processors 402 and 404 include a memory interface that provides a dedicated memory for the processors. A DDR channel and the connected DDR DIMMs can be in accordance with a particular DDR standard, such as a DDR3 standard, a DDR4 standard, a DDR5 standard, or the like. Memory 420 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 430 is connected to chipset 410 via a graphics interface 432, and provides a video display output 436 to a video display 434. An example of a graphics interface 432 includes a Peripheral Component Interconnect-Express (PCIe) interface and graphics adapter 430 can include a four lane (x4) PCIe adapter, an eight lane (x8) PCIe adapter, a 16-lane (x16) PCIe adapter, or another configuration, as needed or desired. In a particular embodiment, graphics adapter 430 is provided down on a system printed circuit board (PCB). Video display output 436 can include a Digital Video Interface (DVI), a High-Definition Multimedia Interface (HDMI), a DisplayPort interface, or the like, and video display 434 can include a monitor, a smart television, an embedded display such as a laptop computer display, or the like.

NV-RAM 440, disk controller 450, and I/O interface 470 are connected to chipset 410 via an I/O channel 412. An example of I/O channel 412 includes one or more point-to-point PCIe links between chipset 410 and each of NV-RAM 440, disk controller 450, and I/O interface 470. Chipset 410 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. NV-RAM 440 includes BIOS/EFI module 442 that stores machine-executable code (BIOS/EFI code) that operates to detect the resources of information handling system 400, to provide drivers for the resources, to initialize the resources, and to provide common access mechanisms for the resources. The functions and features of BIOS/EFI module 442 will be further described below.

Disk controller 450 includes a disk interface 452 that connects the disc controller to a hard disk drive (HDD) 454, to an optical disk drive (ODD) 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits a solid-state drive (SSD) 464 to be connected to information handling system 400 via an external interface 462. An example of external interface 462 includes a USB interface, a proprietary interface, or a combination thereof. Alternatively, solid-state drive 464 can be disposed within information handling system 400.

I/O interface 470 includes a peripheral interface 472 that connects the I/O interface to add-on resource 474, to TPM 476, and to network interface 480. Peripheral interface 472 can be the same type of interface as I/O channel 412, or can be a different type of interface. As such, I/O interface 470 extends the capacity of I/O channel 412 when peripheral interface 472 and the I/O channel are of the same type, and the I/O interface translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a network communication device disposed within information handling system 400, on a main circuit board of the information handling system, integrated onto another component such as chipset 410, in another suitable location, or a combination thereof. Network interface device 480 includes a network channel 482 that provides an interface to devices that are external to information handling system 400. In a particular embodiment, network channel 482 is of a different type than peripheral channel 472 and network interface 480 translates information from a format suitable to the peripheral channel to a format suitable to external devices. In a particular embodiment, network interface 480 includes a network interface card (NIC) or host bus adapter (HBA), and an example of network channel 482 includes an InfiniBand channel, a Fibre Channel, a Gigabit Ethernet channel, a proprietary channel architecture, or a combination thereof. In another embodiment, network interface 480 includes a wireless communication interface, and network channel 482 includes a WiFi channel, a near-field communication (NFC) channel, a Bluetooth or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 482 can be connected to an external network resource (not illustrated). The network resource can include another information handling system, a data storage system, another network, a grid management system, another suitable resource, or a combination thereof.

BMC 490 is connected to multiple elements of information handling system 400 via one or more management interface 492 to provide out of band monitoring, maintenance, and control of the elements of the information handling system. As such, BMC 490 represents a processing device different from processor 402 and processor 404, which provides various management functions for information handling system 400. For example, BMC 490 may be responsible for power management, cooling management, and the like. The term baseboard management controller (BMC) is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers.

Capabilities and functions provided by BMC 490 can vary considerably based on the type of information handling system. BMC 490 can operate in accordance with an Intelligent Platform Management Interface (IPMI). Examples of BMC 490 include an Integrated Dell Remote Access Controller (iDRAC). Management interface 492 represents one or more out-of-band communication interfaces between BMC 490 and the elements of information handling system 400, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on information handling system 400, that is apart from the execution of code by processors 402 and 404 and procedures that are implemented on the information handling system in response to the executed code. BMC 490 operates to monitor and maintain system firmware, such as code stored in BIOS/EFI module 442, option ROMs for graphics interface 430, disk controller 450, add-on resource 474, network interface 480, or other elements of information handling system 400, as needed or desired. In particular, BMC 490 includes a network interface 494 that can be connected to a remote management system to receive firmware updates, as needed or desired. Here, BMC 490 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 490 utilizes various protocols and application programming interfaces (APIs) to direct and control the processes for monitoring and maintaining the system firmware. An example of a protocol or API for monitoring and maintaining the system firmware includes a graphical user interface (GUI) GUI associated with BMC 490, an interface defined by the Distributed Management Taskforce (DMTF) (such as a Web Services Management (WS-MAN) interface, a Management Component Transport Protocol (MCTP) or, a Redfish interface), various vendor defined interfaces (such as a Dell EMC Remote Access Controller Administrator (RACADM) utility, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 490 is included on a main circuit board (such as a baseboard, a motherboard, or any combination thereof) of information handling system 400, or is integrated onto another element of the information handling system such as chipset 410, or another suitable element, as needed or desired. As such, BMC 490 can be part of an integrated circuit or a chip set within information handling system 400. An example of BMC 490 includes an integrated Dell remote access controller (iDRAC), or the like. BMC 490 may operate on a separate power plane from other resources in information handling system 400. Thus BMC 490 can communicate with the management system via network interface 494 while the resources of information handling system 400 are powered off. Here, information can be sent from the management system to BMC 490 and the information can be stored in a RAM or NV-RAM associated with the BMC. Information stored in the RAM may be lost after power-down of the power plane for BMC 490, while information stored in the NV-RAM may be saved through a power-down/power-up cycle of the power plane for the BMC.

The term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein. In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system, comprising:
   a processor;
   a first memory device including a first voltage regulator configured to be enabled by a first command from the processor; and
   a second memory device including a second voltage regulator configured to be enabled by a second command from the processor;
   wherein the processor is configured to:
      boot the information handling system, wherein in booting the information handling system, the processor further provides the first command to the first memory device and the second command to the second memory device;
      detect that one of the first and second memory devices failed to boot;
      determine that it is unknown whether the failing memory device is the first memory device or the second memory device; and
      in response to determining that it is unknown whether the failing memory device is the first memory device or the second memory device, determine which one of the first and second memory devices failed to boot, wherein in determining which one of the first and second memory devices failed to boot, the processor is further configured to:
         reboot the information handling system a first time, wherein in rebooting the information handling system the first time, the processor further selectively provides one and only one of the first command to the first memory device and the second command to the second memory device; and
         determine whether the selected one of the first and second memory devices failed to boot.

2. The information handling system of claim 1, wherein in selectively providing the first command to the first memory device or providing the second command to the second memory device, the processor uses a search algorithm to determine which one of the first or second commands to provide.

3. The information handling system of claim 2, wherein the search algorithm includes one of a linear search and a binary search.

4. The information handling system of claim 1, wherein the processor is further configured to:
   receive an indication that the first and second memory devices booted successfully.

5. The information handling system of claim 4, wherein in detecting that one of the first and second memory devices failed to boot, the processor is further configured to:
   determine a time when the first command was provided to the first memory device and the second command was provided to the second memory device;

determine that the processor failed to receive the indication within a duration of time from the time when the first and second commands were provide that exceeds a threshold.

6. The information handling system of claim 1, wherein the processor is further configured to:
  receive an indication of a multi-bit error on one of the first and second memory devices.

7. The information handling system of claim 1, wherein, in response determining whether the selected one of the first and second memory devices failed to boot, the processor is further configured to:
  reboot the information handling system a second time, wherein in booting the information handling system the second time, the processor further provides either, but not both of the first command to the first memory device and the second command to the second memory device, based upon the determination whether the selected one of the first and second memory devices failed to boot.

8. The information handling system of claim 1, wherein in response to determining whether the selected one of the first and second memory devices failed to boot, the processor is further configured to:
  store an indication that the selected one of the first and second memory devices failed to boot.

9. The information handling system of claim 8, wherein the indication is stored in one of a non-volatile memory of the information handling system, and a non-volatile memory of the selected one of the first and second memory devices.

10. The information handling system of claim 1, wherein the first and second memory devices are Double Data Rate-5 (DDR5) Dual In-Line Memory Modules (DIMMs).

11. A method, comprising:
  booting, by a processor of an information handling system, the information handling system, wherein booting the information handling system further includes:
    providing, by the processor, a first command to a first memory device to enable a first voltage regulator of the first memory device; and
    providing, by the processor, a second command to a second memory device to enable a second voltage regulator of the second memory device;
  detecting, by the processor, that one of the first and second memory devices failed to boot; and
  determining that it is unknown whether the failing memory device is the first memory device or the second memory device; and
  in response to determining that it is unknown whether the failing memory device is the first memory device or the second memory device, determining, by the processor, which one of the first and second memory devices failed to boot, wherein determining which one of the first and second memory devices failed to boot further includes:
    rebooting, by the processor, the information handling system;
    selectively providing, by the processor, a third command to one and only one of the first memory device to enable the first voltage regulator or the second memory device to enable the second voltage regulator; and
    determining, by the processor, whether the selected one of the first and second memory devices failed to boot.

12. The method of claim 11, wherein in selectively providing the third command to one of the first and second memory devices, the processor uses a search algorithm to determine which one of the first or second commands to provide.

13. The method of claim 12, wherein the search algorithm includes one of a linear search and a binary search.

14. The method of claim 11, further comprising:
  receiving, by the processor, an indication that the first and second memory devices booted successfully.

15. The method of claim 14, wherein detecting that one of the first and second memory devices failed to boot further includes:
  determining, by the processor, a time when the first command was provided to the first memory device and the second command was provided to the second memory device;
  determining, by the processor, that the processor failed to receive the indication within a duration of time from the time when the first and second commands were provide that exceeds a threshold.

16. The method of claim 11, wherein the processor is further configured to:
  receive an indication of a multi-bit error on one of the first and second memory devices.

17. The method of claim 11, wherein, in response determining whether the selected one of the first and second memory devices failed to boot, the method further comprises:
  rebooting the information handling system a second time, wherein in booting the information handling system the second time, the method further comprises:
  providing either, but not both of the first command to the first memory device and the second command to the second memory device, based upon the determination whether the selected one of the first and second memory devices failed to boot.

18. The method of claim 11, wherein in response to determining whether the selected one of the first and second memory devices failed to boot, the method further comprises:
  storing an indication that the selected one of the first and second memory devices failed to boot.

19. The method of claim 18, wherein the indication is stored in one of a non-volatile memory of the information handling system, and a non-volatile memory of the selected one of the first and second memory devices.

20. An information handling system, comprising:
  a processor;
  a first Dual Data Rate-5 (DDR5) Dual In-Line Memory Module (DIMM) including a first voltage regulator configured to be enabled by a first command from the processor; and
  a second DDR5 DIMM including a second voltage regulator configured to be enabled by a second command from the processor;
  wherein the processor is configured to:
    boot the information handling system, wherein in booting the information handling system, the processor further provides the first command to the first DDR5 DIMM and the second command to the second DDR5 DIMM;
    detect that one of the first and second DDR5 DIMMs failed to boot, wherein in detecting that one of the first and second DDR5 DIMMs failed to boot, the processor is further configured to:
      determine a time when the first command was provided to the first DDR5 DIMM and the second command was provided to the second DDR5 DIMM; and determine that the processor failed to receive an indication within a duration of time from the time when the first and second commands were provide that exceeds a threshold; and in response to detecting that one of the first and second DDR5 DIMMs failed to boot, determine which one of the first and second DDR5 DIMMs failed to boot, wherein in determining which one of the first and second DDR5 DIMMs failed to boot, the processor is further configured to:

reboot the information handling system, wherein in rebooting the information handling system, the processor further selectively provides one and only one of the first command to the first DDR5 DIMM and the second command to the second DDR5 DIMM; and determine whether the selected one of the first and second DDR5 DINMs failed to boot.

* * * * *